United States Patent
Bonart

(10) Patent No.: US 10,861,781 B2
(45) Date of Patent: Dec. 8, 2020

(54) SEMICONDUCTOR CHIP COMPRISING A MULTIPLICITY OF EXTERNAL CONTACTS, CHIP ARRANGEMENT AND METHOD FOR CHECKING AN ALIGNMENT OF A POSITION OF A SEMICONDUCTOR CHIP

(71) Applicant: Infineon Technologies AG, Neubiberg (DE)

(72) Inventor: Dietrich Bonart, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 1 day.

(21) Appl. No.: 16/204,445

(22) Filed: Nov. 29, 2018

(65) Prior Publication Data

US 2019/0172779 A1 Jun. 6, 2019

(30) Foreign Application Priority Data

Dec. 1, 2017 (DE) .......................... 10 2017 128 568

(51) Int. Cl.
*H01L 23/498* (2006.01)
*H01L 23/31* (2006.01)
(Continued)

(52) U.S. Cl.
CPC .... *H01L 23/49827* (2013.01); *H01L 23/3114* (2013.01); *H01L 23/49816* (2013.01); *H01L 23/49894* (2013.01); *H01L 23/544* (2013.01); *H01L 25/0657* (2013.01); *H01L 25/50* (2013.01); *H01L 2223/54426* (2013.01);
(Continued)

(58) Field of Classification Search
CPC . H01L 23/49827; H01L 23/544; H01L 25/50; H01L 23/49816; H01L 23/49894; H01L 25/0657; H01L 23/3114; H01L 2225/06527; H01L 2223/54473; H01L 2225/06513; H01L 2223/54426; H01L 22/12; H01L 22/34
See application file for complete search history.

(56) References Cited

U.S. PATENT DOCUMENTS 10,600,789 B2 * 3/2020 Ha ..................... H01L 27/10817
2002/0070438 A1 6/2002 Ference et al.
(Continued)

FOREIGN PATENT DOCUMENTS

JP S5737844 A 3/1982

*Primary Examiner* — Victor A Mandala
(74) *Attorney, Agent, or Firm* — Murphy, Bilak & Homiller, PLLC

(57) ABSTRACT

A semiconductor chip includes a mounting surface having a plurality of first conductive contacts and at least one second conductive contact. Each of the first contacts is arranged in a regularly spaced apart array such that centroids of immediately adjacent first contacts are separated from one another in a first direction by a first distance. Each of the first contacts have an identical first lateral extent. The second conductive contact is at least partially within an area which has the first lateral extent and is separated from an immediately first contact by the first distance. Either the second conductive contact has a second lateral extent that is less than the first lateral extent; or a centroid of the second conductive contact is separated in the first direction from the centroid of one of the first contacts by a second distance that is different from the first distance.

11 Claims, 12 Drawing Sheets

(51) Int. Cl.
  *H01L 25/065* (2006.01)
  *H01L 25/00* (2006.01)
  *H01L 23/544* (2006.01)

(52) U.S. Cl.
  CPC ............... *H01L 2223/54473* (2013.01); *H01L 2225/06513* (2013.01); *H01L 2225/06527* (2013.01)

(56) References Cited

U.S. PATENT DOCUMENTS

| | | | |
|---|---|---|---|
| 2002/0158326 A1* | 10/2002 | Furuya | H01L 24/27 257/687 |
| 2002/0195706 A1 | 12/2002 | Irie | |
| 2004/0124540 A1* | 7/2004 | Chen | H01L 23/49838 257/777 |
| 2010/0305900 A1* | 12/2010 | Folmar | B23H 9/00 702/155 |
| 2012/0038061 A1* | 2/2012 | Su | H01L 23/49827 257/777 |
| 2012/0241208 A1* | 9/2012 | Petersen | H01L 23/49838 174/266 |
| 2014/0264847 A1* | 9/2014 | Takahashi | H01L 25/0657 257/737 |
| 2017/0372464 A1* | 12/2017 | Kitamura | G06K 9/00 |
| 2018/0002161 A1* | 1/2018 | Jenkins | B81C 1/00158 |
| 2018/0096939 A1* | 4/2018 | Chiu | H01L 23/5386 |
| 2018/0130841 A1* | 5/2018 | Watanabe | H05K 1/02 |
| 2019/0035754 A1* | 1/2019 | Uesaka | H01L 23/49811 |
| 2019/0088547 A1* | 3/2019 | Chiu | H01L 23/3135 |

\* cited by examiner

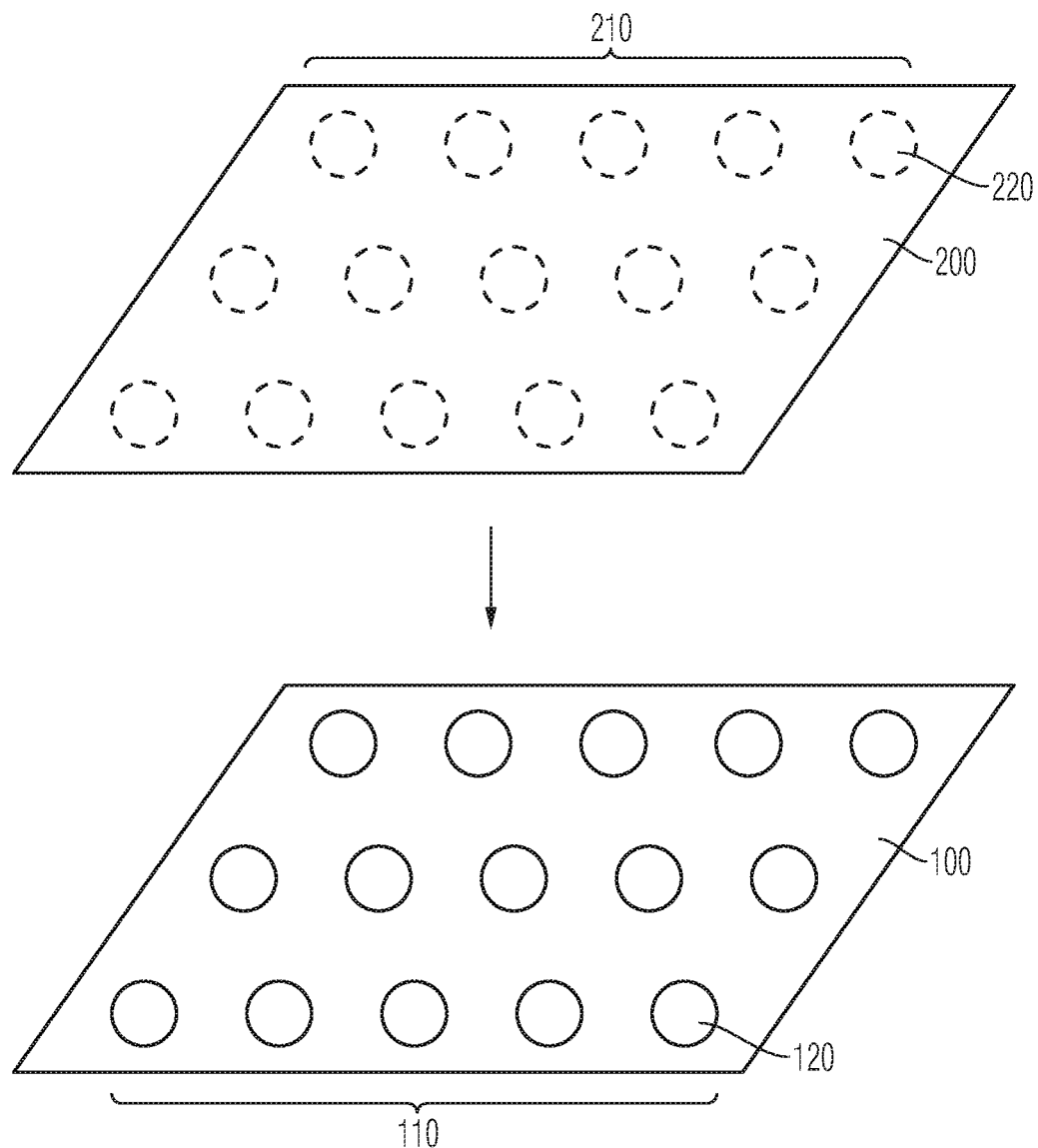

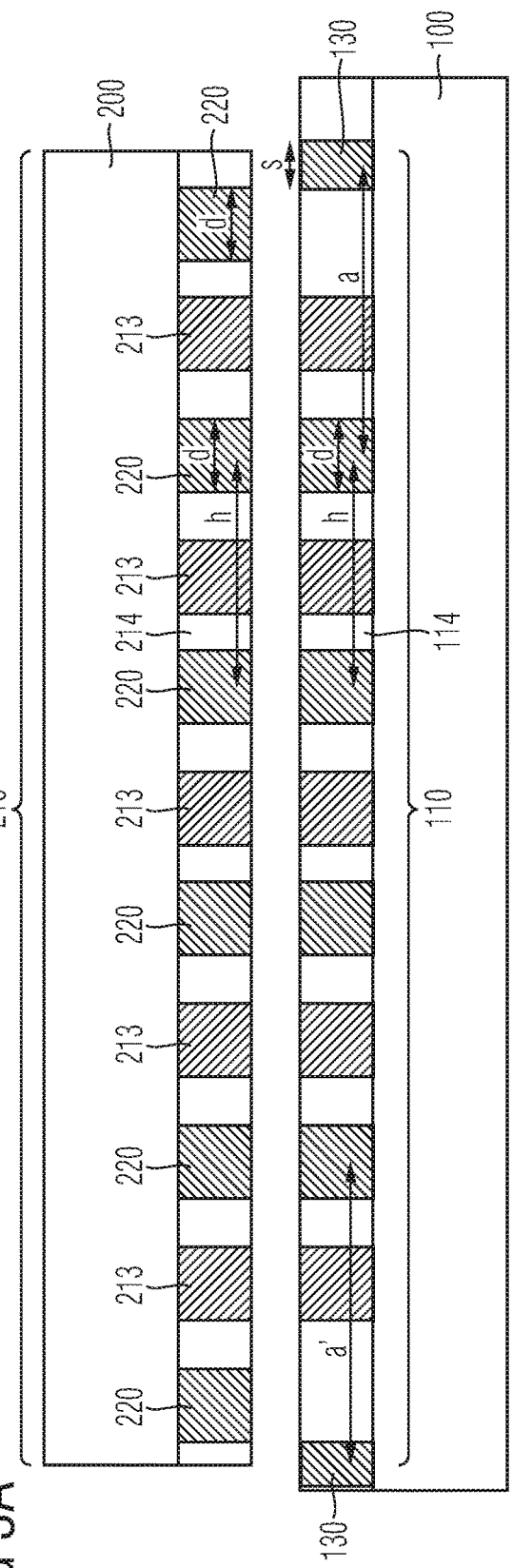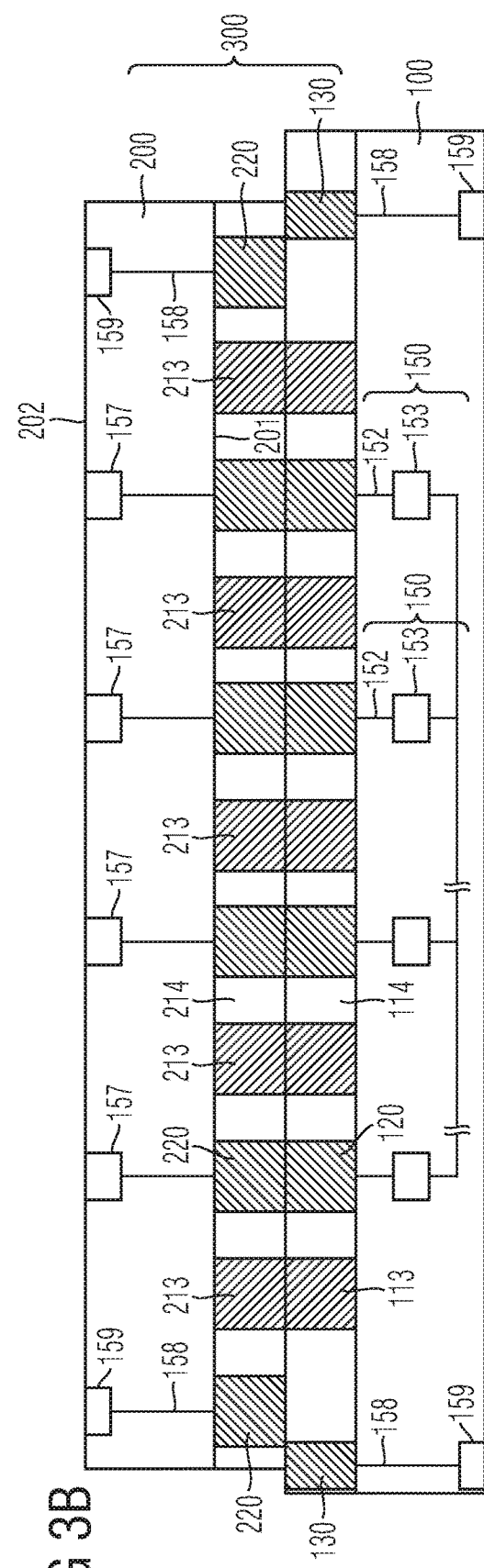

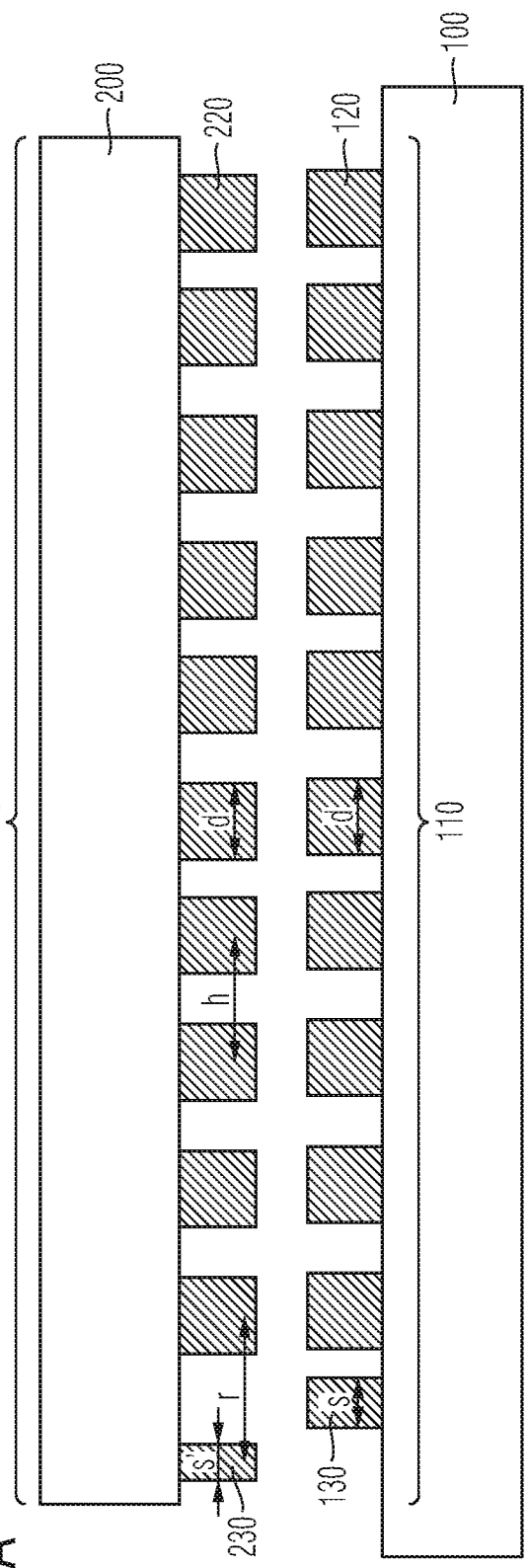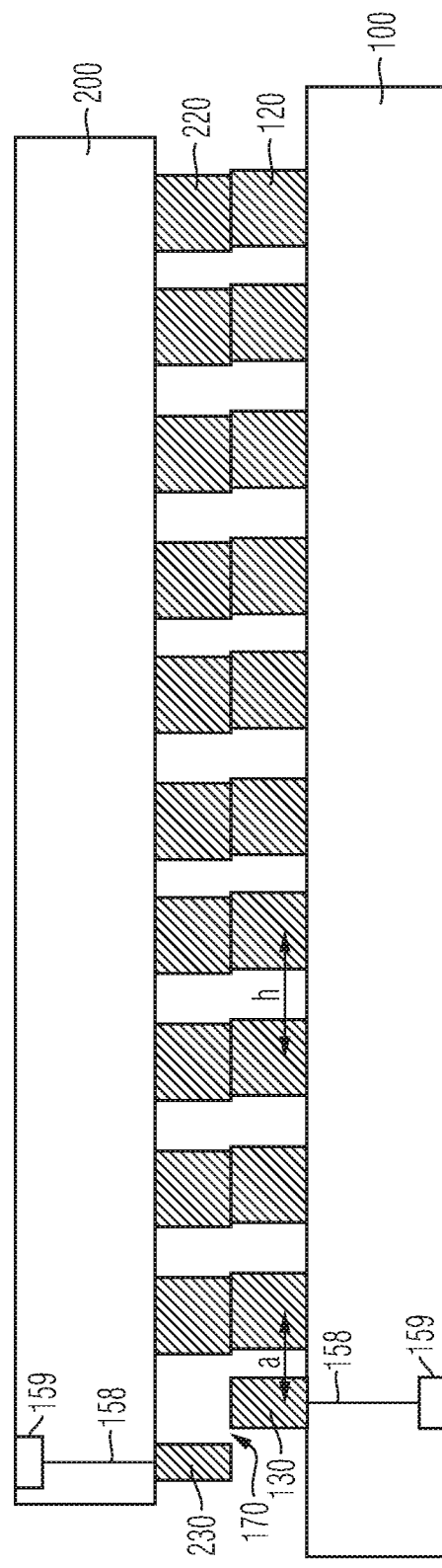

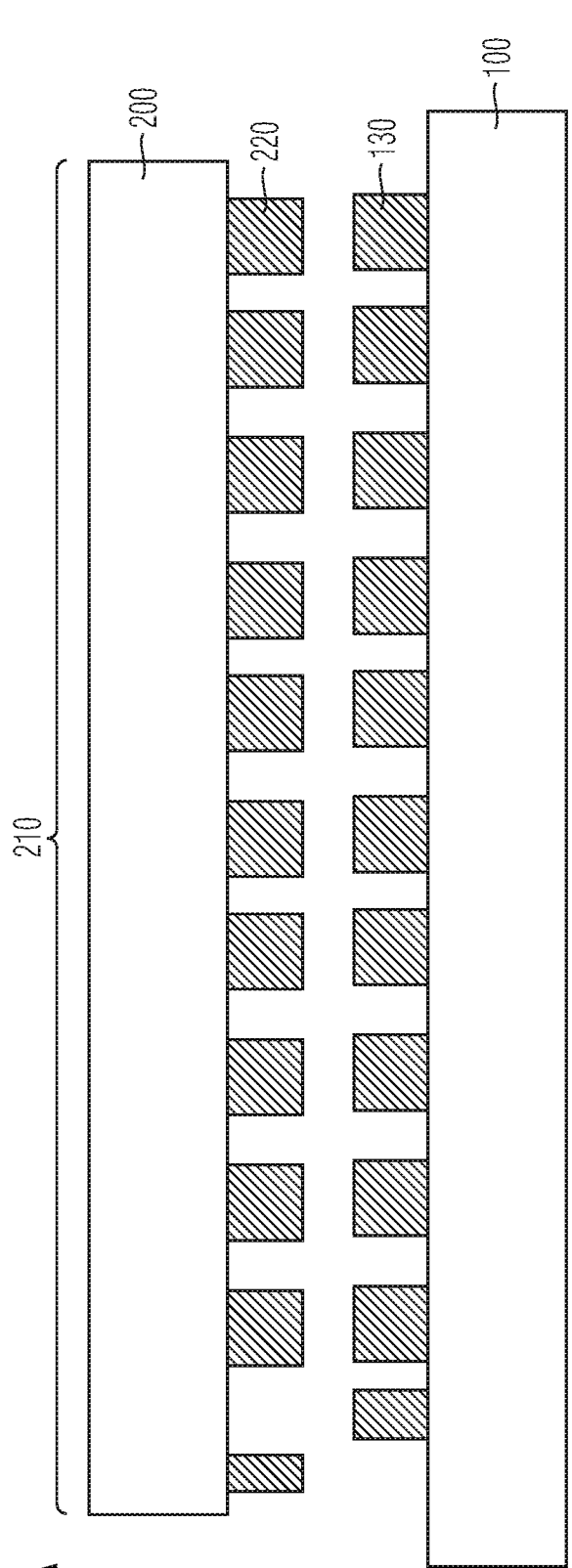
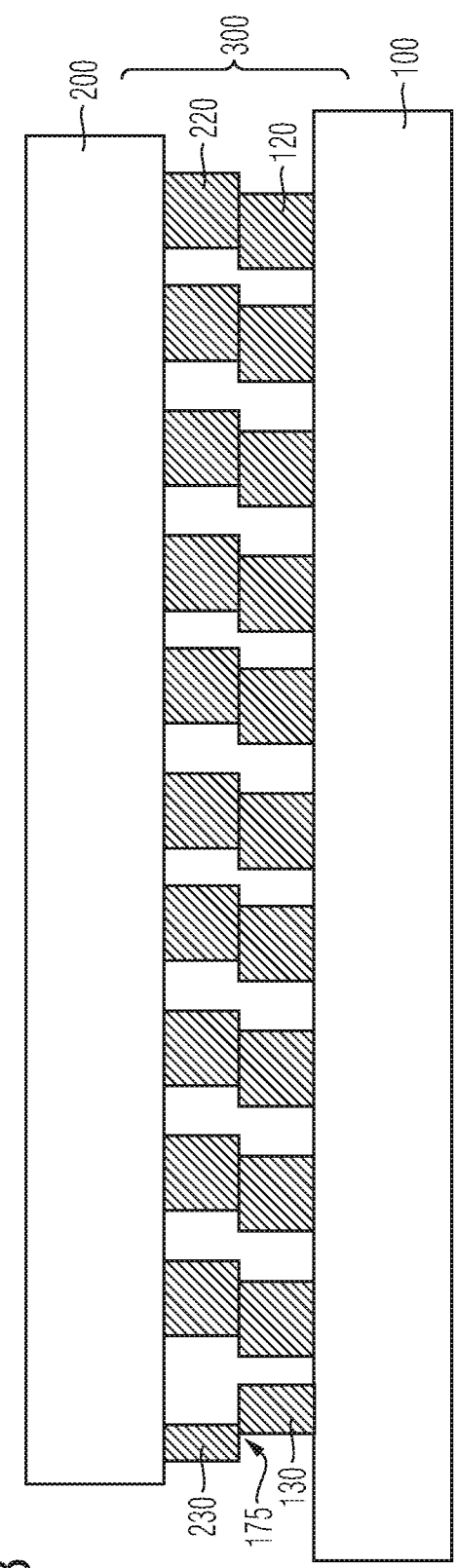
FIG 6A
FIG 6B

SEMICONDUCTOR CHIP COMPRISING A MULTIPLICITY OF EXTERNAL CONTACTS, CHIP ARRANGEMENT AND METHOD FOR CHECKING AN ALIGNMENT OF A POSITION OF A SEMICONDUCTOR CHIP

PRIORITY CLAIM

This application claims priority to German Patent Application No. 10 2017 128 568.7, filed on 1 Dec. 2017, the content of said German application incorporated herein by reference in its entirety.

TECHNICAL FIELD

The application relates to a semiconductor chip comprising a multiplicity of external contacts, to a chip arrangement and to a method for checking an alignment of a position of a semiconductor chip.

BACKGROUND

During the production of complex semiconductor components, various component parts are formed on different semiconductor chips and subsequently joined together. By way of example, individual illumination elements may be formed on one semiconductor chip, while component parts of an associated driver circuit are formed in another semiconductor chip. The two semiconductor chips are then connected to one another by soldering. A very good alignment of the respective semiconductor chips is necessary in order to provide reliable electrical connections between the contacts of the semiconductor chips. If the respective contacts are inadequately aligned with one another, weak connections may occur, which entail a reliability risk.

It is desirable to provide an improved semiconductor chip, an improved chip arrangement and an improved method for checking an alignment of the position of a semiconductor chip in relation to a further semiconductor chip.

SUMMARY

The object mentioned above is achieved by means of the subject matter of the independent patent claims. The dependent claims relate to developments of the subject matter of the application.

A semiconductor chip is disclosed. According to an embodiment, the semiconductor chip includes a mounting surface comprising a plurality of first conductive contacts and at least one second conductive contact. Each of the first contacts in the plurality is arranged in a regularly spaced apart array such that centroids of immediately adjacent ones of the first contacts are separated from one another in a first direction by a first distance. Each of the first contacts in the plurality have an identical first lateral extent. The at least one second conductive contact is at least partially within an area which has the first lateral extent and is separated from an immediately adjacent one of the first contacts in the first direction by the first distance. At least one of the following is true: the at least one second conductive contact has a second lateral extent that is less than the first lateral extent; or a centroid of the at least one second conductive contact is separated in the first direction from the centroid of the immediately adjacent one of the first contacts by a second distance that is different from the first distance.

According to another embodiment, the semiconductor chip includes a mounting surface comprising a plurality of first conductive contacts and at least one second conductive contact. Each of the first contacts in the plurality is arranged in a regularly spaced apart array such that centroids of immediately adjacent ones of the first contacts are separated from one another in a first direction by a first distance. Each of the first contacts in the plurality have an identical first lateral extent. The at least one second conductive contact is disposed in the first direction between the regularly spaced apart array and a first outer edge side of the semiconductor chip. At least one of the following is true: the at least one second conductive contact has a second lateral extent that is less than the first lateral extent; or a centroid of the at least one second conductive contact is separated in the first direction from the centroid of the immediately adjacent one of the first contacts by a second distance that is different from the first distance.

According to another embodiment, the semiconductor chip includes a mounting surface comprising a plurality of first conductive contacts and at least one second conductive contact. Each of the first contacts in the plurality is arranged in a regularly spaced apart array such that centroids of immediately adjacent ones of the first contacts are separated from one another in a first direction by a first distance. A central one of the first contacts is surrounded on either side by outer ones of the first contacts. Each of the first contacts in the plurality have an identical first lateral extent. The second contact has a second lateral extent that is less than the first lateral extent. The second conductive contact is disposed between two of the first contacts in the first direction such that first and second distances between the second conductive contact and the two of the first contacts are each less than the first distance.

In accordance with embodiments of the invention, a semiconductor chip comprises an arrangement composed of a multiplicity of first external contacts arranged in a manner corresponding to a regular pattern. The arrangement furthermore comprises a second external contact, which differs from the first external contacts in a lateral extent or the position of which is displaced relative to a position defined by a regular pattern.

In accordance with further embodiments, the first external contacts are arranged in each case in rows and columns and the second external contact is arranged at a position that is displaced relative to an associated row or column.

In accordance with one or more embodiments, the second external contact is provided instead of a corresponding first external contact.

By way of example, the second external contact can be arranged at the edge of the arrangement. In accordance with embodiments, the second external contact, if the semiconductor chip is joined together with a further semiconductor chip, can lead to an open connection location or to a connection location having restricted functionality. In this case, a positioning at the edge of the arrangement may be advantageous.

In accordance with further embodiments, the second external contact can be provided in addition to the first external contacts. By way of example, the second external contact can be present at a position that lies between positions defined by the regular pattern.

By way of example, the position and lateral extent of the second external contact can be dimensioned such that the second external contact at least partly lies in a tolerance range defined with respect to the regular pattern. In this case, if the semiconductor chip is joined together with a further semiconductor chip to form a chip arrangement, with a closed electrical connection of the second external contact with respect to an associated first external contact of the further semiconductor chip, the alignment of the two semiconductor chips can be rated as good.

Alternatively, the position and size of the second external contact can be dimensioned such that the second external contact lies outside a tolerance range defined with respect to the regular pattern. In this case, if the semiconductor chip is joined together with a further semiconductor chip to form a chip arrangement, with an open electrical connection of the second external contact with respect to an associated first external contact of the further semiconductor chip, the alignment of the two semiconductor chips can be rated as good.

By way of example, the lateral extent of the second external contact can be smaller than the lateral extent of the first contacts. In particular, the lateral extent of the second external contacts can be less than half of the lateral extent of the first contacts.

In accordance with embodiments, the position of the second external contact can be displaced relative to a position defined by the regular pattern by less than half of the lateral extent of the first contacts.

In accordance with further aspects of the invention, a chip arrangement comprises a first semiconductor chip and a second semiconductor chip. In this case, the first semiconductor chip comprises a first arrangement composed of a multiplicity of first external contacts arranged in a manner corresponding to a predetermined pattern. The first arrangement furthermore comprises a second external contact, which differs from the first external contacts in a lateral extent or the position of which is displaced relative to a position defined by the predetermined pattern. The second semiconductor chip comprises a second arrangement of a multiplicity of first external contacts arranged in a manner corresponding to the predetermined pattern. In this context, the predetermined pattern is defined by the fact that it stipulates both the positions of the first external contacts of the first semiconductor chip and the positions of the first external contacts of the second semiconductor chip. By way of example, the predetermined pattern can be a regular pattern in which the contacts are arranged e.g. in columns and rows. However, it can also be irregular.

The second arrangement of the second semiconductor chip can comprise a second external contact, which differs from the first external contacts in a lateral extent or the position of which is displaced relative to a position defined by the predetermined pattern.

By way of example, the second external contact is provided in each case instead of a corresponding first external contact. If both the first and the second semiconductor chip comprise a second external contact, then the latter are arranged such that they are not connected to one another when the semiconductor chips are joined together, rather each of the second external contacts is connected to a first external contact.

However, it is also possible for the second external contact to be provided in each case in addition to the first external contacts. In this case, the second external contacts are arranged in each case such that they are connected to one another when the semiconductor chips are joined together.

In the case of the chip arrangement described, one of the semiconductor chips can contain individually driveable individual elements and the other of the semiconductor chips can comprise a driver circuit for driving the individual elements.

By way of example, the individual elements can be light-generating, light-capturing or light-modifying elements.

In accordance with embodiments, each of the second external contacts of the first semiconductor chip can be electrically connected to an associated contact of the second semiconductor chip.

Alternatively, each of the second external contacts of the first semiconductor chip can be electrically isolated from an associated contact of the second semiconductor chip.

By way of example, the position and lateral extent of the second external contact can be dimensioned such that the second external contact at least partly lies in a tolerance range defined with respect to the predetermined pattern. In this case, in the chip arrangement, with a closed electrical connection of the second external contact with respect to an associated first external contact of the second semiconductor chip, the alignment of the two semiconductor chips can be rated as good.

Alternatively, the position and size of the second external contact can be dimensioned such that the second external contact lies outside a tolerance range defined with respect to the predetermined pattern. In this case, in the chip arrangement, with an open electrical connection of the second external contact with respect to an associated first external contact of the second semiconductor chip, the alignment of the two semiconductor chips can be rated as good.

In accordance with embodiments, the position of the second external contact can be displaced relative to a position defined by the predetermined pattern by less than half of the lateral extent of the first contacts.

In accordance with a further aspect of the invention, a method for checking an alignment of the position of a first semiconductor chip in relation to a second semiconductor chip in a chip arrangement as described above comprises checking an electrical connection between in each case the second external contacts and an associated contact of the second semiconductor chip, wherein a test result is obtained. The alignment of the positions is subsequently rated on the basis of the test result.

By way of example, the alignment of the positions can be rated as good if all the second external contacts and respectively associated contacts of the respective other semiconductor chip are connected to one another.

Alternatively, the alignment of the positions can be rated as good if all the second external contacts are electrically isolated from the associated contacts of the respective other semiconductor chip.

In accordance with further configurations, a semiconductor wafer can be constructed in a manner corresponding to the construction of the semiconductor chip. Furthermore, a wafer arrangement can be constructed in a manner corresponding to the structure of the chip arrangement. Moreover, a method for checking an alignment of a position of a semiconductor wafer can be configured in a manner corresponding to the method described.

The person skilled in the art will discern additional features and advantages after reading the following detailed description and considering the accompanying drawings.

BRIEF DESCRIPTION OF THE DRAWINGS

The accompanying drawings serve to afford an understanding of exemplary embodiments of the invention. The drawings illustrate exemplary embodiments and together with the description serve for the elucidation thereof. Further exemplary embodiments and numerous advantages from among those intended are directly evident from the detailed description below. The elements and structures shown in the drawings are not necessarily illustrated in a manner true to scale with respect to one another. Identical reference signs refer to identical or mutually corresponding elements and structures.

FIGS. 2A, 2B, 2C are cross-sectional views and a perspective view, respectively, which in each case illustrate the joining together of two semiconductor chips.

FIGS. 3A and 3B are cross-sectional views illustrating the joining together of two semiconductor chips in accordance with embodiments of the invention.

FIGS. 5A and 5B are schematic cross-sectional views showing the joining together of two semiconductor chips in accordance with further embodiments of the invention.

FIGS. 6A and 6B are schematic cross-sectional views showing the joining together of two semiconductor chips in accordance with further embodiments of the invention.

DETAILED DESCRIPTION

Figure 1A:
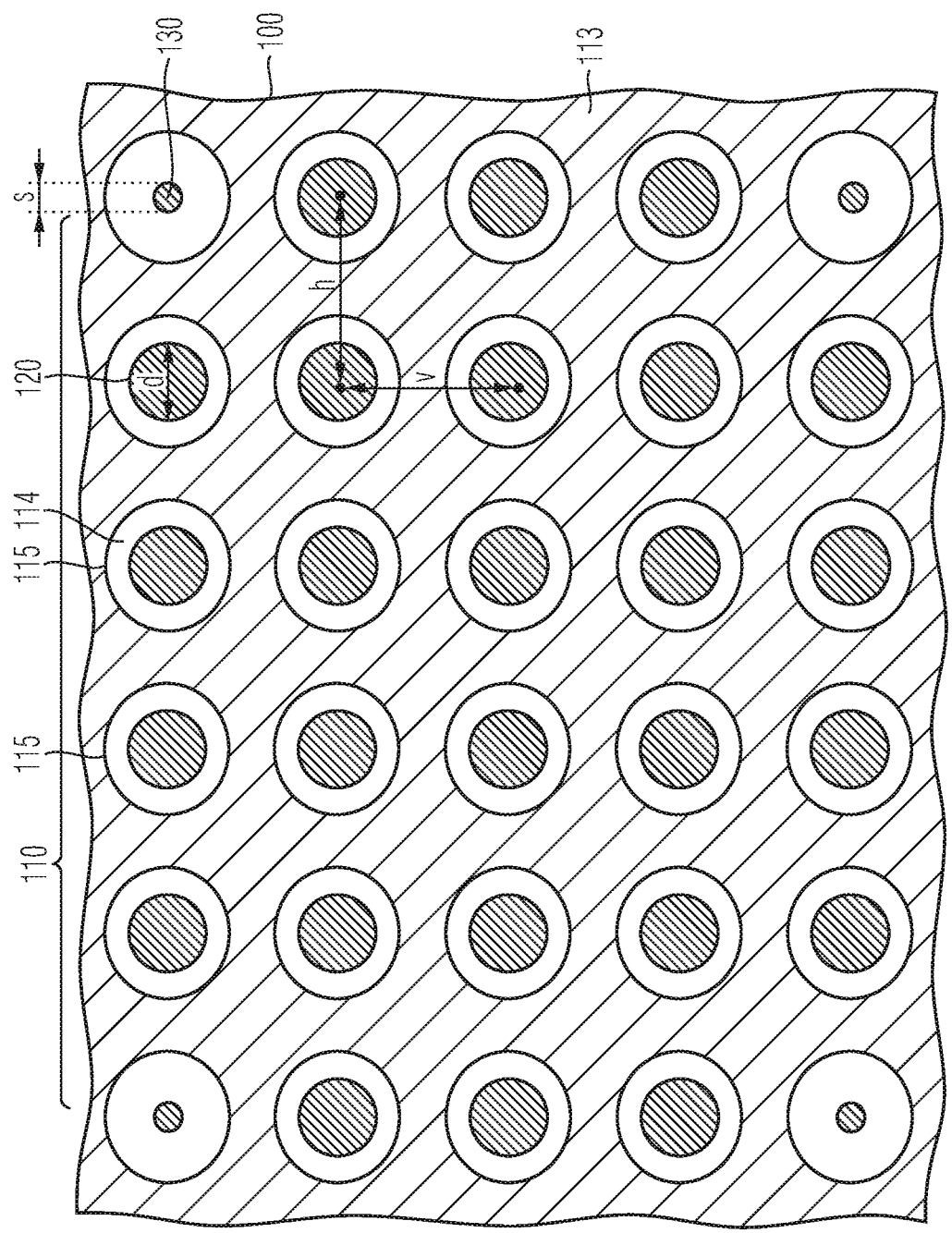
FIGS. 1A, 1B, 1C show schematic plan views of semiconductor chips in accordance with embodiments of the invention.

In the following detailed description, reference is made to the accompanying drawings, which form part of the disclosure and show for illustration purposes specific exemplary embodiments. In this context, direction terminology such as "top side", "bottom", "front side", "rear side", "at the front", "at the back", etc. is employed with respect to the orientation of the figures currently being described. Since the component parts of the exemplary embodiments can be positioned in different orientations, the direction terminology serves only for elucidation and is not restrictive in any way.

The description of the exemplary embodiments is not restrictive since other exemplary embodiments also exist and structural or logical changes can be made, without in so doing departing from the scope defined by the patent claims. In particular, elements of exemplary embodiments described below can be combined with elements of other exemplary embodiments from among those described, unless something to the contrary is evident from the context.

In the context of this description, the terms "coupled" and/or "electrically coupled" do not necessarily mean that the elements must be directly coupled to one another—intervening elements can be provided between the "coupled" or "electrically coupled" elements. The term "electrically connected" describes a low-impedance electrical connection between the connected elements.

The terms "lateral" and "horizontal", as used in this description, are intended to describe an orientation or alignment which extends substantially parallel to a first surface of a semiconductor substrate or semiconductor body. This can be for example the surface of a wafer or of a die or of a chip.

The term "vertical", as used in this description, is intended to describe an orientation which extends substantially perpendicular to the first surface of the semiconductor substrate or semiconductor body.

In the context of the present disclosure, the term "semiconductor chip" denotes a semiconductor lamina having functional elements arranged in the semiconductor lamina. Usually, in order to produce semiconductor components, the latter are firstly processed in and/or on semiconductor wafers and are singulated into individual semiconductor chips after the completion of the individual component parts. As will be set out in the description below, the functional elements can comprise arbitrary circuit elements but also integrated circuits such as, for example, driver circuits etc. Further examples of the functional elements are, for example, light-emitting elements, e.g. LEDs, image sensors or else light-modifying elements. In accordance with further embodiments, the term "semiconductor chip" can also be extended to semiconductor basic elements of larger size such as semiconductor wafers, for example.

The term "semiconductor" encompasses arbitrary semiconductor materials, for example silicon, silicon-on-insulator (SOI), silicon-on-sapphire (SOS), doped and undoped semiconductors, epitaxial layers of silicon, carried by a basic semiconductor support, and further semiconductor structures. The semiconductor can also be based on a material different from silicon or a compound semiconductor. The semiconductor could likewise be silicon-germanium, germanium or gallium arsenide. In accordance with further embodiments, silicon carbide (SiC) or gallium nitride (GaN) can form the semiconductor substrate material. The semiconductor material need not necessarily be monocrystalline, but rather can also be amorphous or polycrystalline and be selected in accordance with the application. If, as described in the present description, semiconductor chips are stacked one on top of another, then they can be based on different semiconductor materials.

The term "arrangement" relates to a multiplicity of contacts arranged in spatial proximity to one another. The term "arrangement" does not mean that all the contacts must be arranged in a regular pattern, for example. As will be described, the contacts can be arranged in a predetermined pattern. If a semiconductor chip is connected to a further semiconductor chip, for example, then the pattern can be predetermined by the arrangement of the contacts on the further semiconductor chip. However, the pattern can also be predetermined by the fact that it is a regular pattern. Furthermore, individual contacts can also be arranged at a position that is displaced relative to a position defined by the regular or predetermined pattern. The term "spatial proximity" means, for example, that the distance between all contacts among one another is not greater than double the average distance within the arrangement.

As will be described in the description below, first contacts are arranged in a manner corresponding to a predetermined or regular pattern. That is to say that the pattern indicates an arrangement specification, for example, in accordance with which the individual first contacts are arranged. Examples of patterns are for example a pattern in which the contacts are arranged in a manner corresponding to rows and columns, or else a checkered pattern.

FIG. 1A shows a schematic plan view of part of a semiconductor chip 100. The semiconductor chip 100 comprises an arrangement 110 composed of external electrical contacts 120, 130. By way of example, the first external contacts 120 are arranged in a manner corresponding to a regular pattern. As shown in FIG. 1A, this pattern can provide, for example, for the external contacts 120 to be arranged in each case in rows and columns, and for the distance between adjacent external contacts 120 in a row to correspond in each case to the distance between external contacts 120 in a column. In accordance with embodiments, the first external contacts 120 can have an identical lateral extent in each case.

The term "distance" as used in the context of the present description generally denotes the distance between centroids, for example midpoints, of the respective contacts 120.

The arrangement 110 firstly contains first external contacts 120 arranged in a manner corresponding to the regular pattern. Furthermore, the arrangement comprises at least two second external contacts 130. The second external contacts differ from the first external contacts in each case in a lateral extent. Furthermore, a position of the second external contacts can be displaced in each case relative to a position defined by the regular pattern.

The external contacts are in each case provided for electrically connecting towards the outside component parts that are arranged in the interior of the semiconductor chip, i.e. below the illustration plane illustrated. By way of example, external contacts are arranged on the surface of the semiconductor chip and face towards the outside, i.e. in a direction outside the semiconductor chip. In accordance with further embodiments, parts of the component parts to be electrically connected can also be arranged on a surface of the semiconductor chip that is situated opposite the main surface illustrated.

The semiconductor chip can comprise further external contacts arranged outside the arrangement 110 illustrated. "Outside the arrangement 110 illustrated" can mean here that for example a distance between the further external contacts and an arbitrary contact of the arrangement is more than twice the magnitude of the average distance, predefined by the pattern, between adjacent first external contacts. However, the term "outside the arrangement" can also mean that a lateral extent of the contact is at least double the magnitude of the lateral extent of the first external contacts 120.

The term "lateral extent", as used here, can mean in particular the largest lateral extent of a contact. In other words, if an electrical contact for example is not formed in a circular fashion, as illustrated in FIG. 1A, but rather for example in a rectangular or oval shape, then the term "lateral extent" means the lateral extent in accordance with the longitudinal direction of the contact.

As is illustrated in FIG. 1A, the first external contacts 120 are arranged at a distance h in the row direction and a distance v in the column direction. A lateral extent of the first external contacts is indicated by d. The second external contacts 130 have a lateral extent s that is smaller than the lateral extent d.

In FIG. 1A, a target position of the electrical contacts is indicated in each case by reference signs 115. The first external contacts 120 are arranged in a centred manner in relation to the target position 115. By way of example, a lateral dimensioning of the first external contacts can be 30 μm and a distance between the first external contacts 120 and the edge of the target position can be 15 μm. The arrangement can contain 100 contacts or more, for example 1024 (32×32) contacts or more. In accordance with further embodiments, an arrangement can contain up to 600×600 contacts, for example 500×500 contacts. The distance between first external contacts can be for example less than 150 μm, e.g. 125 μm. Depending on the number of contacts, however, said distance can also be considerably smaller.

In accordance with embodiments, an insulating material 114 can be present at the target positions 115. The surface of the external contacts 120, 130 can be flush with the surface of the insulating material. Furthermore, a surface of the material 113 surrounding the target positions can be flush with the surface of the insulating material and of the external contacts 120, 130. By way of example, the material surrounding the target positions 115 can be conductive. If two semiconductor chips formed in this way are joined together, then pluglike connections form in each case between the external contacts of the semiconductor chips. Surface connections form in each case between the material respectively surrounding the target positions.

In accordance with further embodiments, the material 113 surrounding the target positions can also be a semiconductor or insulating material. Furthermore, the external contacts 120, 130 can project relative to the material of the target positions and/or the material 113 surrounding the target positions.

As is shown in FIG. 1A, the second external contacts 130 can be arranged in each case at corner positions of the arrangement 110. In accordance with further embodiments, the arrangement 110 can also comprise two or second external contacts. Generally, the positioning accuracy is increased by an increase in the number of second external contacts 130; conversely, the second external contacts 130 are not available for producing reliably functioning electrical connections.

Figure 1B:
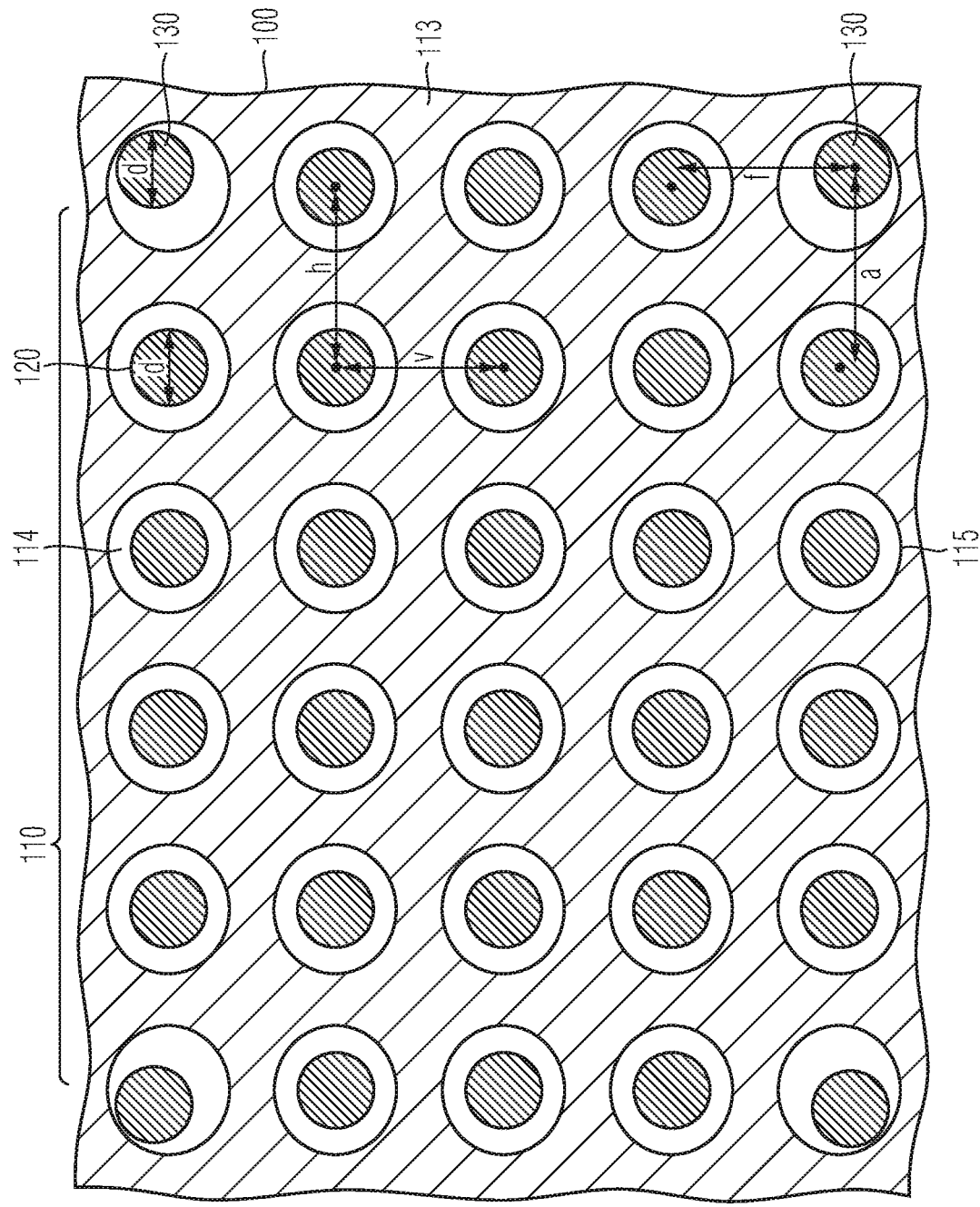

FIG. 1B shows a further schematic plan view of part of a semiconductor chip in accordance with embodiments of the present invention. The semiconductor chip illustrated in FIG. 1B differs from that illustrated in FIG. 1A in that the second external contacts 130 are formed differently from the second external contacts illustrated in FIG. 1A. Unlike in the case of the second external contacts 130 illustrated in FIG. 1A, the lateral extent d of the second external contacts 130 is equal to the lateral extent d of the first external contacts 120. However, the position of the second external contacts is displaced relative to a position predefined by the pattern defined by the first external contacts 120. To put it more precisely, a distance a between the second external contact 130 and an adjacent contact in the row direction is greater or less than the distance h in the row direction between the first electrical contacts. Furthermore, the distance f in the column direction between the second external contact 130 and an adjacent first external contact 120 is greater or less than the distance v between adjacent first external contacts in the column direction. The condition that the position is displaced relative to a position defined by the regular pattern is met if a≠h or f≠v.

In the case of the arrangement illustrated in FIG. 1B, the second external contacts 130 can remain in each case within the target position 115.

Figure 1C:
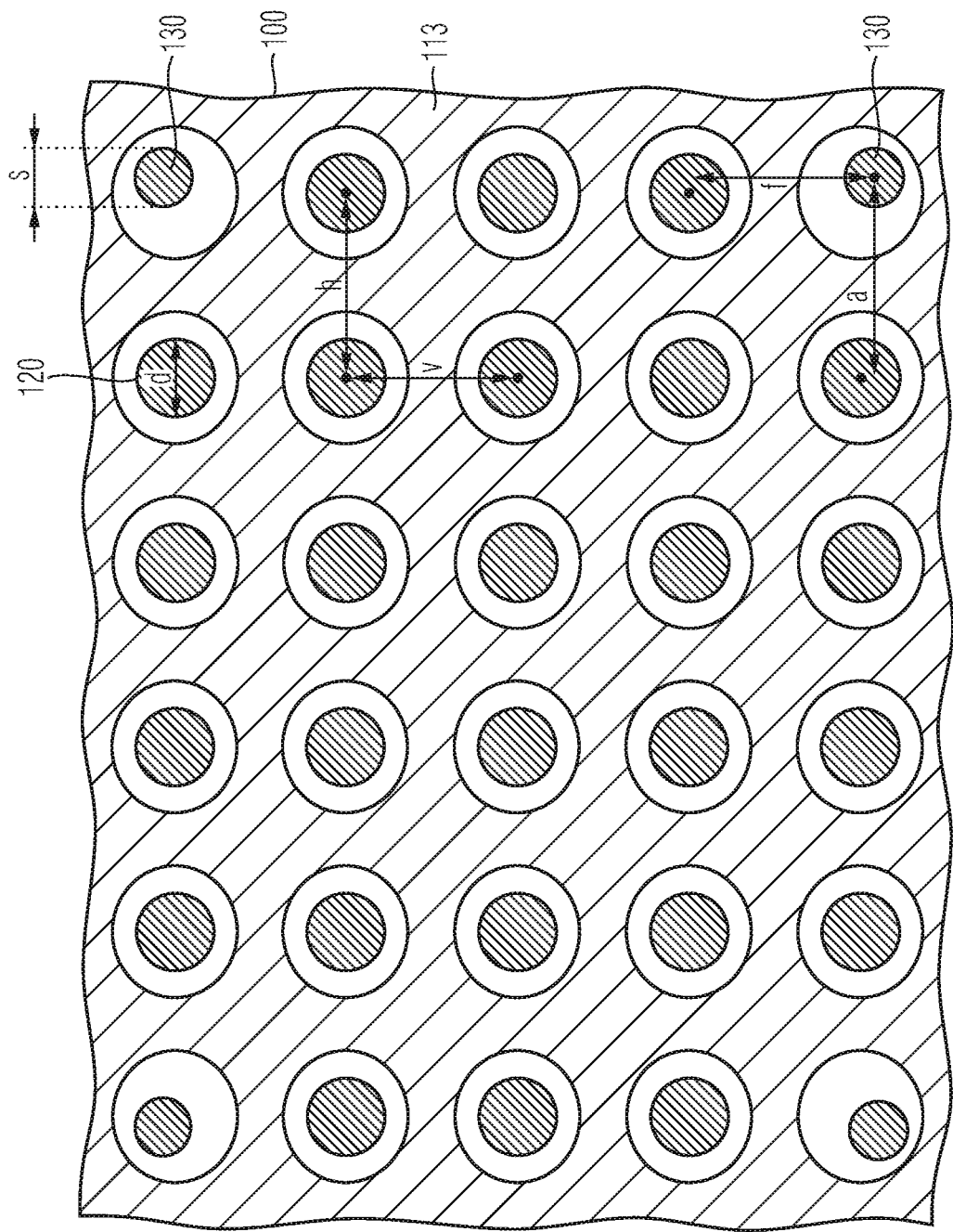

In accordance with embodiments illustrated in FIG. 1C, a lateral extent of the second external contacts 130 is smaller than the lateral extent of the first external contacts. Furthermore, the position of the second external contacts 130 is displaced relative to a position defined by the regular pattern, i.e. a≠h and/or f≠v. By way of example, a can be greater than h and/or f can be greater than v.

By way of example, the second external contact can have a diameter of 5 μm and be displaced by 5 μm in the row direction and/or column direction.

In accordance with embodiments of the invention, a lateral extent, that is to say for example the diameter, of the second external contacts can be less than half or even one third of the lateral extent of the first external contacts. In accordance with further embodiments of the invention, the extent of the displacement relative to a position defined by the regular pattern can be less than half or even one third of the lateral extent of the first external contacts.

Figure 2A:
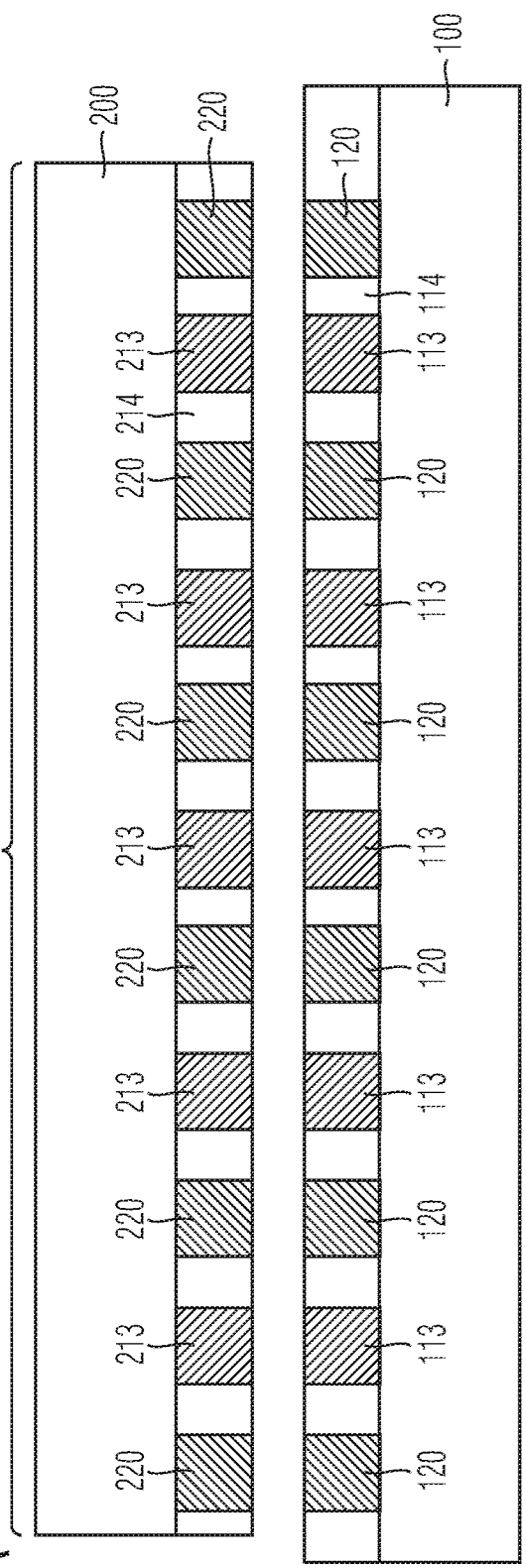
Figure 2B:
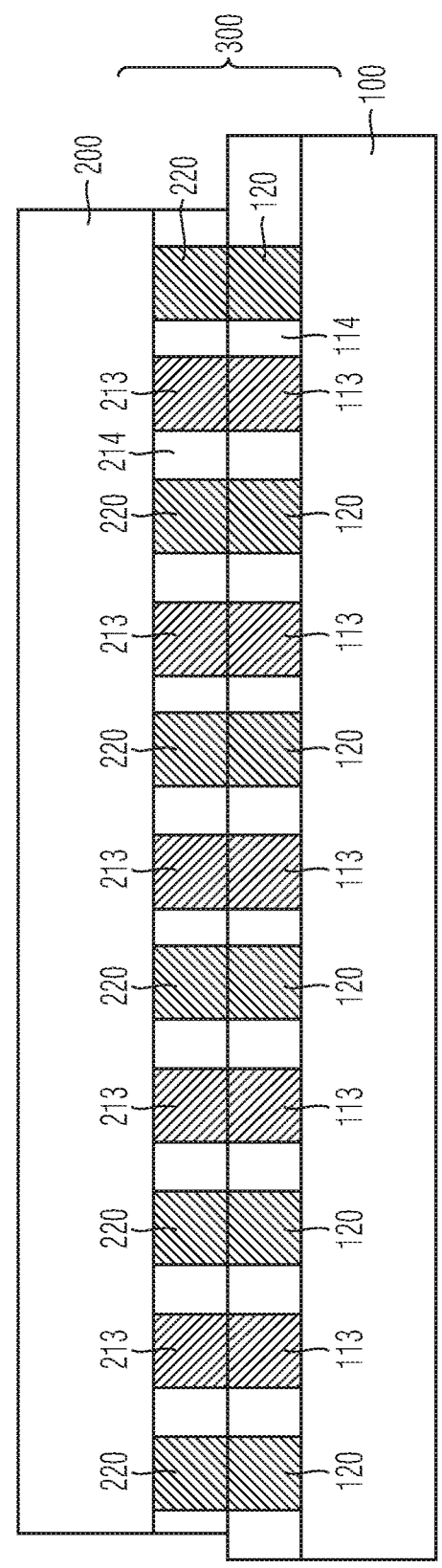

FIGS. 2A and 2B show cross sections through a first semiconductor chip 100 and a second semiconductor chip 200 when they are joined together to form a chip arrangement. The first semiconductor chip 100 comprises a multiplicity of first external contacts 120 arranged in a manner corresponding to a predetermined pattern. The second semiconductor chip 200 likewise comprises a multiplicity of first external contacts 220 arranged in a manner corresponding to the predetermined pattern. In this case, the predetermined pattern of the first external contacts 120 of the first semiconductor chip is identical to the predetermined pattern of the first external contacts 220 of the second semiconductor chip. The number of external contacts of the first and second semiconductor chips 100, 200 can also be identical in each case.

During the joining together process, the first semiconductor chip 100 and the second semiconductor chip 200 are brought together in such a way that the first contacts of the first semiconductor chip 100 are aligned as accurately as possible relative to the first external contacts 220 of the second semiconductor chip. Given accurate alignment, both semiconductor chips 100, 200 are joined together in such a way that the arrangement shown in FIG. 2B is obtained. The two semiconductor chips are joined together such that the semiconductor surfaces on which the external contacts are arranged in each case are situated opposite one another.

As is discernible in FIG. 2A, the external contacts 120, 220, the material 113, 213 surrounding the target positions and also the insulating material 114, 214 between the external contacts and the material 113, 213 surrounding the target positions are configured in each case flush with one another. However, it goes without saying that the external contacts 120, 220 can project in each case relative to the surrounding material.

As shown in FIG. 2B, first semiconductor chip 100 and second semiconductor chip 200 are ideally aligned with one another, such that the corresponding first contacts 120, 220 can be reliably connected to one another, for example by soldering. In the case of a misalignment of first substrate and second substrate 200, the first external contacts 120 of the first semiconductor chip 100 are displaced relative to the first external contacts 220 of the second semiconductor chip 200, such that—depending on the extent of the misalignment—problems with reliability can occur.

As will be explained below, the second external contacts described in FIGS. 1A to 1C indicate a possibility by means of which the alignment of the position of the second chip in relation to the first chip can be checked and improved.

FIG. 2C shows a schematic perspective plan view of two semiconductor chips 100, 200, wherein the first semiconductor chip 100 contains a first arrangement 110 composed of first external contacts 120 and the second semiconductor chip 200 contains a second arrangement 210 of first external contacts 220 (indicated in a dashed fashion). After stacking one on top of another, the first external contacts 120 of the first semiconductor chip are electrically connected to the first electrical contacts 220 of the second semiconductor chip 200.

FIGS. 3A and 3B then show the joining together of a first semiconductor chip 100 and a second semiconductor chip 200. In this case, the first semiconductor chip 100 is constructed as illustrated in FIGS. 1A to 1C. The first semiconductor chip 100 comprises an arrangement composed of a multiplicity of first external contacts 120. Two second external contacts 130 are arranged at the edge of the arrangement. The first external contacts 120 are arranged in a manner corresponding to a predetermined pattern. The second external contacts firstly have a smaller lateral extent s than the lateral extent d of the first external electrical contacts 120. Furthermore, the position of the second external contacts 130 is displaced relative to a position defined by the predetermined pattern. That is to say that the distance a between the second external contact 130 on the right-hand side of the pattern and the adjacent first external contact 120 is different from, for example greater than, the distance h between adjacent first external contacts. The distance a' between the first external contact 120 on the left-hand side of the arrangement and the adjacent second external contact 130 on the left-hand side of the arrangement is likewise different from, for example greater than, the distance h between adjacent first external contacts. By way of example, the value a can be equal to the value of a' or be different therefrom.

Figure 3C:
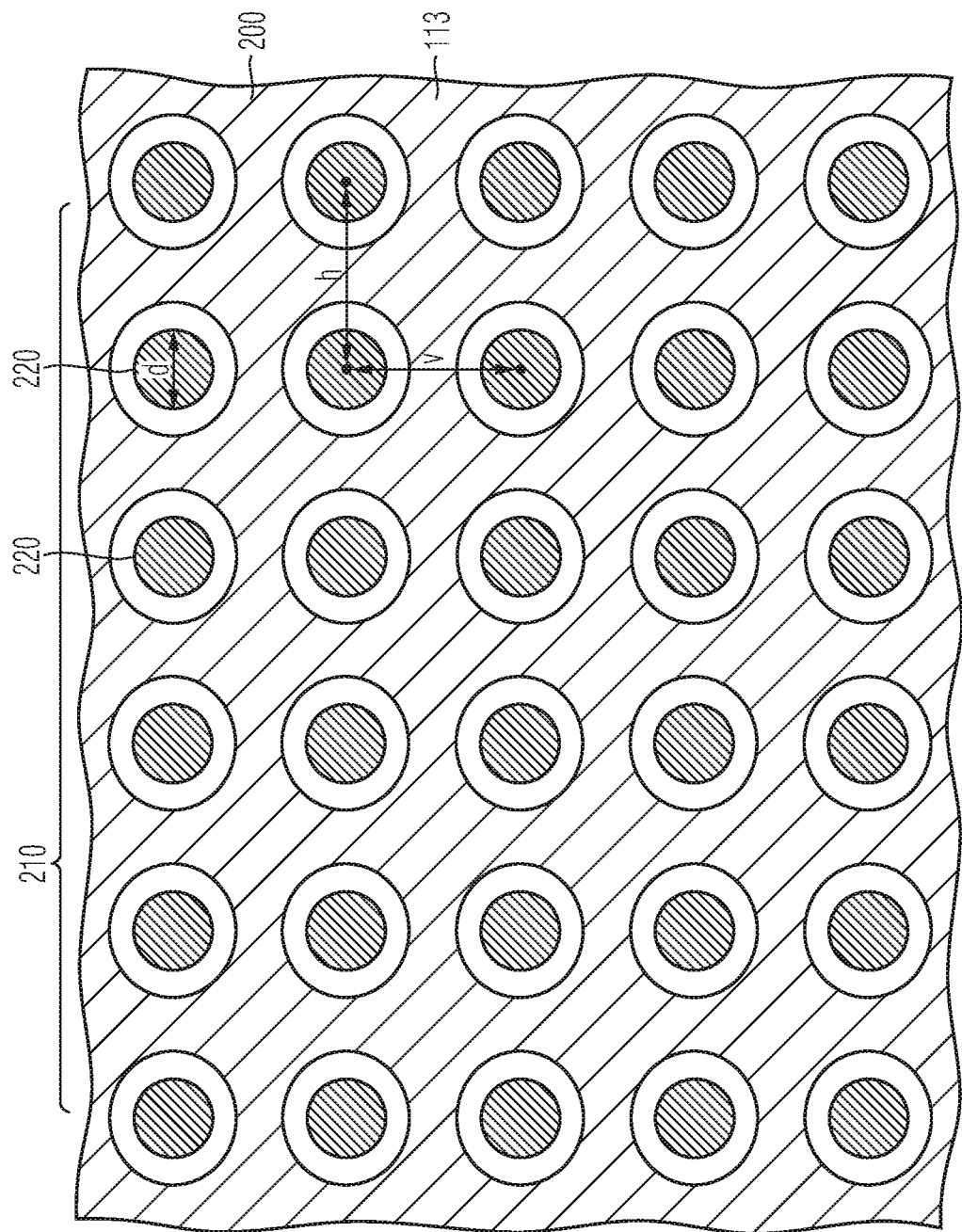
FIG. 3C shows a plan view of one example of a second semiconductor chip.

The second semiconductor chip is shown in plan view in FIG. 3C. As illustrated, the second semiconductor chip 200 contains first external contacts 220 arranged in a manner corresponding to a predetermined pattern corresponding to the pattern of the first external contacts of the first semiconductor chip 100. The second semiconductor chip 200 can likewise comprise second external contacts. In this case, the latter, when the two chips are connected to one another, should be arranged at a location which is different from the location of the second external contacts of the first semiconductor chip 100, in order to achieve a higher accuracy of the alignment. By way of example, in the joined-together state, the second external contact of the first semiconductor chip 100 can be arranged on the right-hand side, while the second external contact of the second semiconductor chip 200 is arranged on the left-hand side of the arrangement. In accordance with further embodiments, provision can be made for the second semiconductor chip 200 to comprise exclusively first external contacts 220 within the arrangement 210. In this case, the first semiconductor chip can comprise two or three external contacts 130.

If the first semiconductor chip and the second semiconductor chip 200, as illustrated in FIG. 3B, are then joined together to form a chip arrangement 300, then with perfect alignment of first semiconductor chip 100 and second semiconductor chip 200 in each case the second external contacts 130 can be connected to corresponding electrical first external contacts of the second semiconductor chip 200. It is also discernible in FIG. 3B that with even slight deviation of the position of the upper chip 200, the electrical connection between the right-hand second external contact 130 and the associated first external contact of the second semiconductor chip 200 or between the left-hand second external contact 130 of the first semiconductor chip 100 and the associated first external contact of the second semiconductor chip 200 is interrupted. In this case, by checking the electrical connection between the respective second external contacts 130 and the associated first contacts 220 of the second semiconductor chip 200, it is easily possible to ascertain whether the second semiconductor chip 200 is correctly aligned in relation to the first semiconductor chip 100.

In accordance with embodiments of the invention, component parts of an integrated circuit 150 can be provided, for example, in at least one of the two semiconductor chips 100, 200. By way of example, the integrated circuit 150 can comprise a multiplicity of drive circuits or individual driver circuits 153 for driving elements in the second semiconductor chip 200. The individual driver circuits 153 can be connected to the first external contacts 120 and the second external contacts 130 in each case via connecting lines 152. A multiplicity of individual functional elements 157 can be arranged in each case in the second semiconductor chip 200. By way of example, the functional elements 157 can be light-emitting elements arranged in a manner adjoining a second main surface 202 of the second semiconductor chip 200, while the first electrical contacts 220 are arranged in a manner adjoining a first main surface 201 of the second semiconductor substrate 200. In accordance with further embodiments, however, the functional elements 157 can also comprise other components, for example light-capturing elements, for example CMOS image sensors, or light-modifying elements, for example LCD (liquid crystal display) liquid crystal elements.

The second external contacts 130 can be at a position which is redundant for the functionality of the entire chip arrangement, such that even a failure after a relatively short lifetime does not adversely affect the overall performance of the component. In accordance with further embodiments, however, it is also conceivable for the second external contacts 130 and the associated first external contacts 220 of the second semiconductor chip 200 not to be connected to functional elements 157 or component parts of the integrated circuit, but rather to be connected to specific evaluation lines and connection areas 159.

As is discernible in FIGS. 3A, 3B, the external contacts 120, 220, the material 113, 213 surrounding the target positions and also the insulating material 114, 214 between the external contacts and the material 113, 213 surrounding the target positions are configured in each case flush with one another. However, it goes without saying that the external contacts 120, 220 can project in each case relative to the surrounding material.

In FIGS. 3A and 3B, the area of the second semiconductor chip 200 deviates only insignificantly from the area of the first semiconductor chip 100. It is also possible for the second semiconductor chip 200 to have a smaller area than the first semiconductor chip 100. By way of example, the first semiconductor chip 100 can also contain many power semiconductor devices that each require a large amount of area. A multiplicity of microcontrollers can be provided in the second semiconductor chip 200. The arrangement of the respective external contacts, as described here, makes it possible to provide an interface with many parallel channels and high accuracy.

It goes without saying that—in a departure from the illustration in FIGS. 3A, 3B—the second external contacts can also, i.e. alternatively or additionally, be provided in the second semiconductor chip 200.

In embodiments described with reference to FIGS. 3A and 3B, the first semiconductor chip 100 and the second semiconductor chip 200 are perfectly aligned with one another if the second external contacts 130 of the first semiconductor chip are in electrical contact with corresponding first external contacts 220 of the semiconductor chip 200. This may be the case, for example, if each of the second external contacts at least partly lies in a tolerance range defined with respect to the predetermined pattern.

Figure 4A:
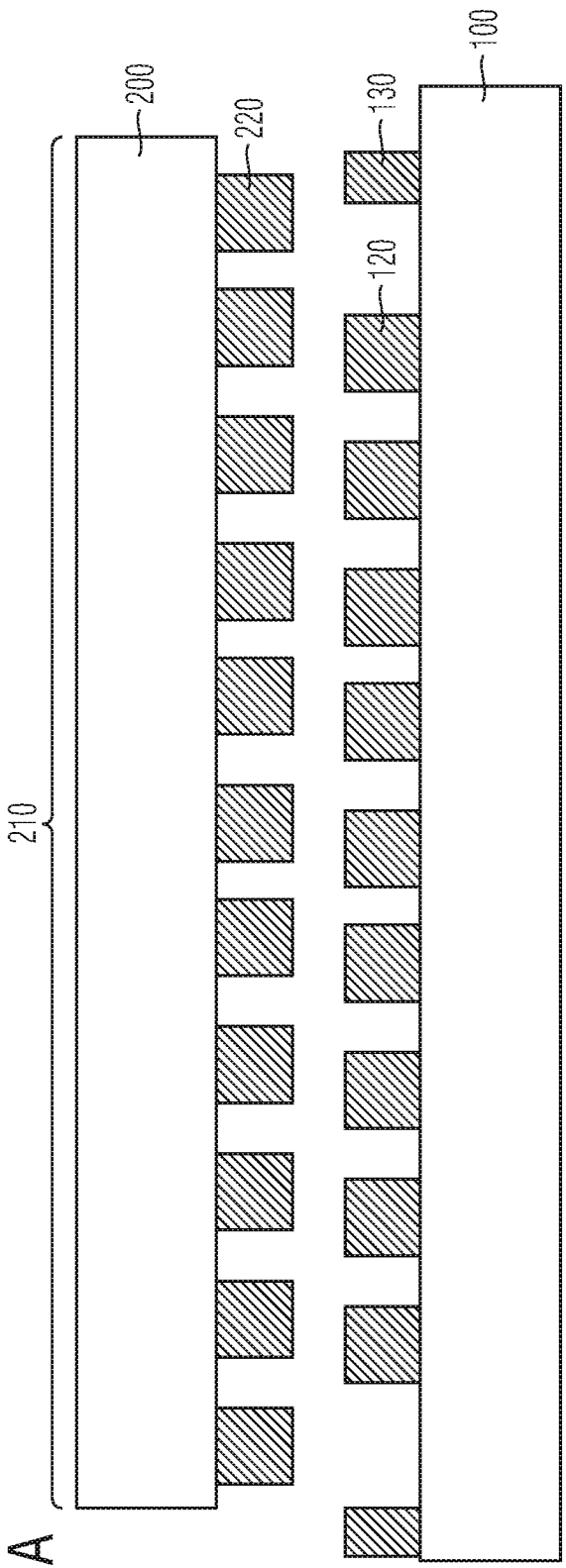
FIGS. 4A and 4B show schematic cross-sectional views showing the joining together of semiconductor chips in accordance with further embodiments of the invention.
Figure 4B:
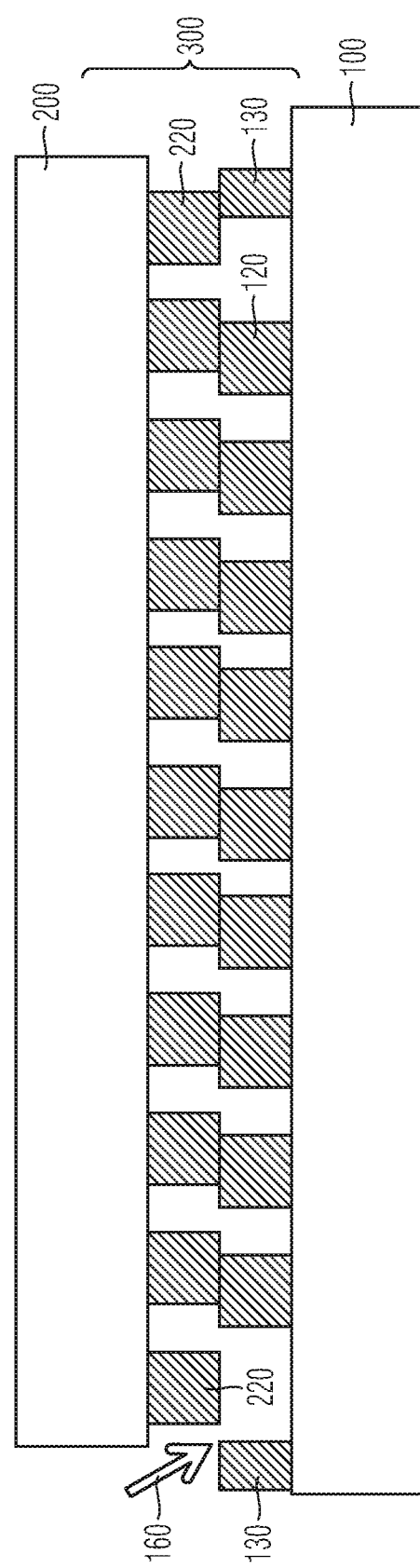

FIGS. 4A, 4B show one example of joining together a chip arrangement 300 made from a first semiconductor chip 100 and a second semiconductor chip 200, wherein good alignment between second semiconductor chip 200 and first semiconductor chip 100 does not take place. The first semiconductor chip 100 and the second semiconductor chip 200 can be constructed as illustrated in FIG. 3A. However, the respective external contacts can also be realized—as illustrated—as projecting contacts. For the explanation of the embodiments it is unimportant whether the contacts are realized as projecting or flush contacts. Unlike in FIG. 3B, however, they are displaced with respect to one another during the joining together process. As a consequence, the left-hand second external contact 130 is not connected to an associated first external contact 220 of the second semiconductor chip 200, such that an open connection location 160 occurs. By checking the electrical connection between in each case the second external contact 130 and an associated contact of the second semiconductor chip 200, it is possible here to ascertain that an open connection location 160 is present, such that overall the alignment of the second semiconductor chip 200 with respect to the first semiconductor chip 100 in accordance with FIG. 4B will be rated as erroneous.

In accordance with further embodiments, it is also possible for the second external contacts all to lie outside a tolerance range defined with respect to the predetermined pattern. In this case, the first semiconductor chip 100 and the second semiconductor chip 200 are perfectly aligned with one another if each second external contact is not connected to an associated first external contact at the second semiconductor chip.

FIGS. 5A, 5B show arrangements of semiconductor chips in accordance with these embodiments. In accordance with these embodiments, the respective external contacts are again illustrated as projecting contacts. It goes without saying, however, that they can also be realized as flush contacts.

As will be explained with reference to FIGS. 5A and 5B, in these embodiments an open connection location 170 is an indication of a good alignment between first semiconductor chip 100 and second semiconductor chip 200. FIG. 5A shows one example of a first semiconductor chip 100 and a second semiconductor chip 200 in accordance with one or more embodiments of the present invention. The first semiconductor chip 100 comprises an arrangement 110 composed of first external contacts 120 arranged in a manner corresponding to a predetermined pattern. Furthermore, the arrangement 110 comprises a second external contact 130, which differs from the first contact 120 firstly in its size, i.e. its lateral extent. Furthermore, its position is displaced relative to a position defined by the predetermined pattern. The second semiconductor chip 200 comprises an arrangement 210. The arrangement 210 comprises a multiplicity of first external contacts 220 arranged in accordance with the predetermined pattern. The arrangement 210 furthermore comprises a second external contact 230, which likewise both differs from the first external contacts in its lateral extent and the position of which furthermore is displaced relative to a position defined by the predetermined pattern.

To put it more precisely, the lateral extent s' of the second contact 230 of the second semiconductor chip 200 is different from a lateral extent d of the first external contacts 220 of the second semiconductor chip. Furthermore, the distance r between the second external contact 230 and an adjacent first external contact of the second semiconductor chip 200 is different from the distance between adjacent first external contacts 220 of the second semiconductor chip 200. By way of example, the lateral extent s of the second external contact 130 of the semiconductor chip 100 can be approximately 3 to 10 μm, e.g. 5 μm. The distance r between the second external contact 230 and the adjacent first external contact 220 of the second semiconductor chip 200 is dimensioned such that no electrical connection arises given correct alignment of first and second semiconductor chips. By way of example, the distance r can be more than 10 µm, for example 15 µm.

If the two semiconductor chips are then placed one on top of the other, as shown in FIG. 5B, then the second external contact of the first semiconductor chip 100 and the second external contact of the second semiconductor chip 200 are arranged in such a way that, given perfect alignment, no electrical connection arises between these contacts, but rather an open connection location. In this case, during routine operation of the component, the respective second electrical contacts 130, 230 cannot be used for the functional operation of the component. The second external contacts can be connected to a test terminal 159 for example in each case via an electrical connection element 158, via which test terminal it is possible to check whether or not an open connection location 170 is present. FIGS. 6A and 6B respectively show the individual semiconductor chips 100, 200 and a chip arrangement 300 made from the joined-together first and second semiconductor chips 100, 200 in the case of a non-perfect alignment. In FIGS. 6A and 6B, the contacts are illustrated in each case as projecting contacts, but they can also be flush. The first semiconductor chip 100 illustrated in FIG. 6A and the second semiconductor chip 200 respectively correspond to the first semiconductor chip 100 and second semiconductor chip 200 illustrated in FIG. 5A. If they are not joined together perfectly, then only partly overlapping first contacts 120, 220 arise, as illustrated in FIG. 6B, as a result of which the electrical functionality of the chip arrangement 300 or the reliability thereof can be adversely affected. Furthermore, the second contact 130 of the first semiconductor chip 100 and the second external contact 230 of the second semiconductor chip 200 are connected to one another via a closed connection location 175, which indicates in this case that the first semiconductor chip 100 and the second semiconductor chip 200 are not perfectly aligned with one another.

In this configuration, the second external contact is not available for example for a connection to the individual elements to be driven. It can be provided for example subsequently and in addition to the contacts for driving the individual elements. By way of example, the test terminal 159 of one of the two semiconductor chips can be configured such that it is connectable to a potential in such a way that, given erroneous alignment of the semiconductor chips and electrical connection of the respective second external contacts, a potential value tapped off at the other semiconductor chip is at "incorrect". By way of example, the potential can be a supply voltage for one of the semiconductor chips.

Figure 7:
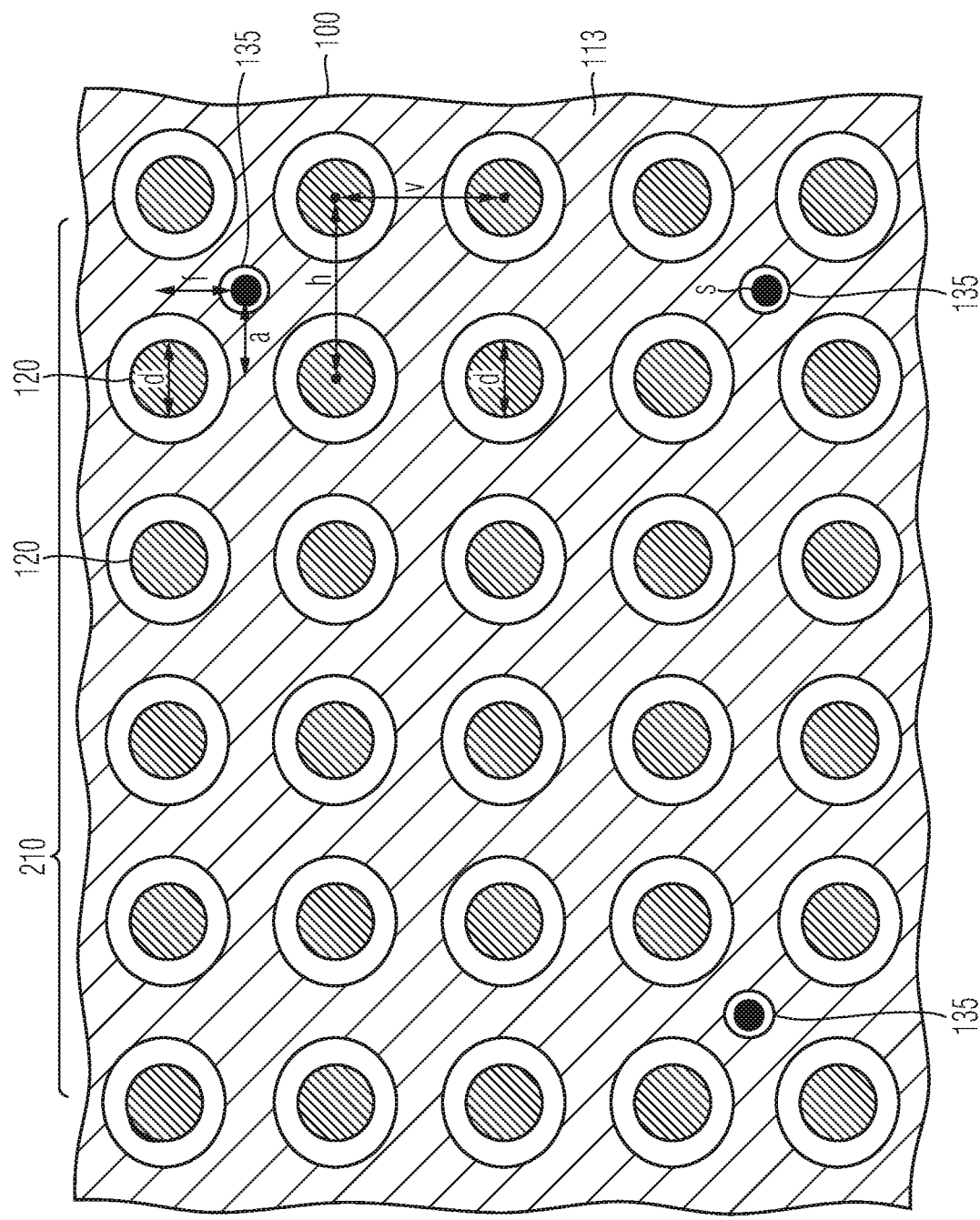
FIG. 7 shows a schematic plan view of a semiconductor chip in accordance with further embodiments of the invention.

FIG. 7 shows a semiconductor chip 100 in accordance with further embodiments of the present invention. In accordance with the embodiments illustrated in FIGS. 1 to 6, the second external contacts can be provided in each case instead of first external contacts. That is to say that the second external contacts are displaced relative to the position defined by the regular pattern. In accordance with the embodiment shown in FIG. 7, however, it is also possible for an additional contact 135 to be provided, which firstly is provided in addition to the first external contacts 120 and secondly lies at a position outside the pattern, for example at the centre between the adjacent first external contacts 120.

In FIG. 7, the second external contact 135 is firstly significantly smaller than the first external contacts in terms of its lateral extent s. Furthermore, the distance a in the row direction is smaller than the distance h between first external contacts 120. Furthermore, the distance in the column direction f is smaller than the distance v between adjacent first contacts 120 in the column direction. If the first external contacts 120 are arranged in a manner corresponding to a pattern of rows and columns, then said second external contact 135 can be arranged for example between adjacent columns and/or between adjacent rows.

The additional second external contacts 135 can have for example a diameter of 1 to 10 µm, e.g. 5 µm, and a distance from an adjacent first contact 120 of 1 to 10 µm, e.g. 5 µm. That is to say that the lateral extent of the second external contact 135 can be less than half, for example less than one third, of the lateral extent of the first external contacts 120. By way of example, it can be arranged in a centred manner between adjacent first external contacts 120.

With the use, too, of second external contacts 135 shown by way of example in FIG. 7, the alignment of two semiconductor chips 100, 200 is rated as good if the electrical connection of the second external contacts 135 of first and second semiconductor chips is good. The second external contacts 135 are usually not used for the functional operation of the component. The second external contacts 135 can be connected to a test terminal 159 via an electrical connection element 158—in a manner similar to that as shown in FIG. 5B.

Figure 8:
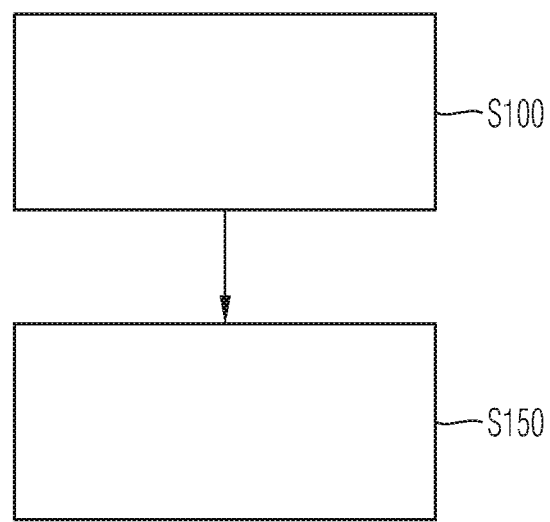
FIG. 8 schematically illustrates a method for checking an alignment of the position of a first semiconductor chip in relation to a second semiconductor chip in accordance with embodiments of the invention.

FIG. 8 schematically illustrates a method in accordance with embodiments of the present invention.

A method for checking an alignment of a position of a first semiconductor chip as described here in relation to a second semiconductor chip in a chip arrangement comprises checking S100 an electrical connection between in each case the second external contacts and an associated contact of the second semiconductor chip, wherein a test result is obtained. The method furthermore comprises rating S150 the alignment of the positions on the basis of the test result.

Semiconductor chips, a chip arrangement and a method for checking an alignment of the position of a first semiconductor chip in relation to a second semiconductor chip have been described in the present description. It goes without saying that the principles described in the application can also be applied to semiconductor wafers. To put it more precisely, the effects described can also occur if semiconductor wafers are joined together to form a wafer arrangement.

Although specific embodiments have been illustrated and described herein, those skilled in the art will recognize that the specific embodiments shown and described can be replaced by a multiplicity of alternative and/or equivalent configurations, without departing from the scope of protection of the invention. The application is intended to cover any adaptations or variations of the specific embodiments discussed herein. Therefore, the invention is restricted only by the claims and the equivalents thereof.

What is claimed is:

1. A semiconductor chip, comprising:
    a mounting surface comprising a plurality of first conductive contacts and at least one second conductive contact,
    wherein each of the first contacts in the plurality is arranged at one of first grid positions defined by a regularly spaced apart array such that centroids of immediately adjacent ones of the first contacts are separated from one another in a first direction by a first distance,
    wherein each of the first contacts in the plurality have an identical first lateral extent, wherein the at least one second conductive contact overlaps with a second grid position defined by the regularly spaced apart array, and wherein a centroid of the at least one second conductive contact is separated in the first direction from the centroid of the immediately adjacent one of the first contacts by a second distance that is different from the first distance.

2. The semiconductor chip of claim 1, wherein the at least one second conductive contact has a second lateral extent that is different from the first lateral extent.

3. The semiconductor chip of claim 2, wherein the as a second lateral extent is less than the first lateral extent.

4. The semiconductor chip of claim 1, wherein the second distance is greater than the first distance.

5. The semiconductor chip of claim 1, wherein the regularly spaced apart array comprises at least one row of the first contacts and at least one column of the first contacts, wherein the at least one row comprises two or more of the first contacts each being separated from one another in the first direction by the first distance, wherein the at least one column comprises two or more of the first contacts each being separated from one another in a second direction by a third distance.

6. The semiconductor chip of claim 5, wherein the third distance is different from the first distance.

7. The semiconductor chip of claim 5, wherein the semiconductor chip comprises four of the second contacts, and wherein the four of the second contacts are disposed at outer corners of the regularly spaced apart array.

8. The semiconductor chip of claim 7, wherein each of the second contacts at the outer corners overlaps with a location that is separated from an outer edge side of an immediately adjacent one of the first contacts in the first direction by the first distance, wherein each of the four second contacts overlaps with a location that is separated from an outer edge side of an immediately adjacent one of the first contacts in the second direction by the third distance.

9. A semiconductor chip, comprising:
a mounting surface comprising a plurality of first conductive contacts and at least one second conductive contact,
wherein each of the first contacts in the plurality is arranged in a regularly spaced apart array such that centroids of immediately adjacent ones of the first contacts are separated from one another in a first direction by a first distance,
wherein each of the first contacts in the plurality have an identical first lateral extent,
wherein the at least one second conductive contact has a second lateral extent that is less than the first lateral extent, and
wherein the at least one second conductive second contact is disposed at an outer corner of the regularly spaced apart array.

10. The semiconductor chip of claim 9, wherein a centroid of the at least one second conductive second contact is separated from the centroid of an immediately adjacent one of the first contacts by the first distance.

11. The semiconductor chip of claim 9, wherein the semiconductor chip comprises four of the second contacts, and wherein the four of the second contacts are disposed at four outer corners of the regularly spaced apart array.

* * * * *